United States Patent [19]
Dicke

[11] Patent Number: 5,117,124
[45] Date of Patent: May 26, 1992

[54] HIGH SPEED INPUT RECEIVER/LATCH

[75] Inventor: Curtis J. Dicke, Medford, Mass.
[73] Assignee: LSI Logic Corp., Milpitas, Calif.
[21] Appl. No.: 629,485
[22] Filed: Dec. 18, 1990
[51] Int. Cl.⁵ .................... H03K 3/29; H03K 3/26
[52] U.S. Cl. ................... 307/272.1; 307/530;
307/291; 307/279
[58] Field of Search .......... 307/272.1, 272.2, 291,
307/262, 359, 353, 530, 475, 362, 279; 330/9

[56] References Cited
U.S. PATENT DOCUMENTS

| | | | |
|---|---|---|---|
| 4,121,120 | 10/1978 | Wetterling | 307/291 |
| 4,302,689 | 11/1981 | Brodie | 307/359 |
| 4,689,497 | 8/1987 | Umeki et al. | 307/272.2 |
| 4,733,111 | 3/1988 | Fassino et al. | 307/272.2 |
| 4,999,528 | 3/1991 | Keech | 307/272.2 |
| 5,004,933 | 4/1991 | Widener | 307/272.1 |

*Primary Examiner*—Stanley D. Miller
*Assistant Examiner*—Toan Tran
*Attorney, Agent, or Firm*—Michael D. Rostoker; Gerald E. Linden

[57] ABSTRACT

A high-speed receiver/latch is implemented by incorporating a differential amplifier/comparator directly into the feedback loop of a latch function. Both transparent and edge-triggered variants are possible. The resulting circuit is capable of extremely high-speed operation by virtue of very small setup time and small propagation delay.

8 Claims, 4 Drawing Sheets

HIGH SPEED INPUT RECEIVER/LATCH

TECHNICAL FIELD OF THE INVENTION

The present invention relates to digital systems, and particularly to line receivers.

BACKGROUND OF THE INVENTION

One major limitation of modern digital systems is the rate at which data may be transferred from one point to another. This is often complicated by the need for signal-level translation as part of the data interchange. As computer systems have progressed, the need has arisen for a higher and higher speed of data interchange, requiring highly optimized transmitter and receiver designs. For very short distances, high data rates do not pose any significant problem, since the typical signal path is shorter than one-quarter wavelength of the highest frequency of interest in the digital signal. A typical modern computer system uses 5 volt single-ended logic signals conveyed by relatively short signal paths (under one foot in length), with minimal shielding of the signals. When the signal path grows significantly longer, however, or when the data rates become extremely high, then the complex impedance characteristics of the signal path (wires) become significant, and transmission line effects must be taken into account and specialized drivers and receivers must be used. If there is any significant distance between digital components, then there is also the factor of noise problems.

Examples of such high speed data exchange may be found in very high speed computers, in high speed data communications (e.g., EIA RS-422), in high speed disk drive interfaces to personal computers, and in high performance data acquisition systems.

For example, in high speed computing systems, where signal frequencies in excess of 100 MHz may be found, ECL (Emitter Coupled Logic) is often used. ECL signals have very high speed edges which have a great deal of high frequency content. In order to carry these high speed signals about circuit boards reliably, a wiring and termination technique known as "Stripline" is often used. Stripline is a method of routing digital signals on a printed circuit board such that the signal carrying wire is always a fixed distance from (parallel to) a known ground (or "shield"). By carefully controlling the wiring geometry, the characteristic impedance of the signal path is well known. When terminated properly, both transmitter and receiver perceive purely resistive loads, and transmission line reflections are minimized. Noise problems are also reduced, due to the shielding effect of the parallel ground. Although the techniques of ECL could be applied to logic levels as high as 5 volts, an unnecessarily large amount of power would be required and a great deal of radiated noise would be generated. In response to this, ECL logic levels are significantly smaller, having about 2 volts of signal swing.

This technique of carefully controlling the impedance and shielding characteristics of the signal path, and of using relatively low (compared to standard TTL) logic levels to reduce power dissipation is common to most high speed digital data interchange systems.

The typical receiver for a high speed data interchange system comprises a differential comparator followed by a latch. FIG. 1a shows an example of such a "receiver/latch". With respect to FIG. 1a, a receiver/latch 100 comprising a differential comparator 150 and a transparent latch 160 is used to process an incoming data signal "DATA +" applied on a line 110 to the "+" input of the comparator 150. A reference voltage "DATA REF" is applied on a line 140 to the "−" input of the comparator 150. This reference voltage is chosen such that it falls roughly in the middle of the two extremes of the signal excursions of "DATA +", thus giving the best noise immunity. (This assumes that the noise is evenly distributed throughout the input voltage range. If this is not so, then DATA REF would be biased one way or the other, accordingly). A LATCH ENABLE signal 120, indicated here as having a negative logic sense by virtue of an "overbar" in its signal name, is used to "open" latch 160 in its active (logic "0") state, or "close" latch 160 is its inactive (logic "1") state. When latch 160 is "open", the LATCHED DATA output 130 follows the logic level of the output of differential comparator 150. When latch 160 is "closed", LATCHED DATA 130 retains its present value regardless of changes at the input of latch 160.

FIG. 1b shows some of the signal timing relationships for the receiver/latch 100 of FIG. 1a, and uses the same numerical designations. With respect to FIG. 1b, an input data signal 110 is shown where periods of stable or "Valid" data are separated by periods of uncertainty where the signal level is either not known or is in transition from one state to another. Typically such an input signal would be sampled at a point when it is stable. Two cases of sampling signals and resultant output signals are set forth in FIG. 1b to illustrate timing relationships for the receiver/latch. In a first case, (case 1) LATCH ENABLE 120 samples "DATA +" 110 at a time when it is known to be stable. In order for LATCHED DATA 130 to reflect valid data at all times, a minimum setup time $t_{su}$ is required between the appearance of valid data on "DATA +" 110 and the active portion of the LATCH ENABLE signal. A certain hold time, $t_h$ is also required after the time the LATCH ENABLE signal goes inactive and before the next region of uncertainty in "DATA +". These minimum setup and hold times are due to delays inherent in the differential comparator 150 and the latch 160. For a system of this type, the effective setup time is given by:

$$t_{su}(\text{overall}) = t_d(\text{comparator 150}) + t_{su}(\text{latch 160})$$

where $t_{su}(\text{overall})$ is the overall effective setup time;
$t_d(\text{comparator 150})$ is the signal propagation delay through comparator 150; and
$t_{su}(\text{latch 160})$ is the minimum setup time for the transparent latch 160.

In the case of hold time, the situation is actually improved by the existence of the comparator, since the delay through the comparator effectively reduces the hold time of the latch. This relationship is given by:

$$t_h(\text{overall}) = t_h(\text{latch 160}) - t_d(\text{comparator 150})$$

where:

$t_h(\text{overall})$ is the overall effective hold time; and
$t_h(\text{1a } t_{ch} \text{ 160})$ is the minimum hold time for latch 160.

The delay from the LATCH ENABLE signal to LATCHED DATA in FIG. 1b is shown as $t_{GO}$.

Case 2 demonstrates the effect of overall propagation delay. In the example of case 2, a wider LATCH ENABLE pulse 120 is applied such that the uncertain period of the input on "DATA +" is reflected in the LATCHED DATA output. The time from when "DATA +" stabilizes to when this stable data is reflected in LATCHED DATA is shown in FIG. 1b gas $t_{DO}$, and is equal to the sum of the propagation delays of the input comparator 150 and transparent latch 160.

Because of large delays and setup times, there is also a great o deal of uncertainty about the exact arrival time of valid data at the output of the latch. This is compounded by the possibility of clock skew in many systems, where there is a relative uncertainty between the timing of the signal ("DATA +", in this case) and the timing of the data recovery clock (LATCH ENABLE, in this case). As a result of such uncertainties, the time period during which the "DATA +" signal may be sampled is narrowed considerably, placing limits on overall system speed and performance.

Clearly, the presence of comparator 150 in this configuration has great effect on the data delays, and depending upon how the input data stream is sampled, this may severely limit the maximum data rate of the data exchange system. In response to these problems, design optimization of input and output receivers is now the focus of many major computer companies.

DISCLOSURE OF THE INVENTION

It is therefore an object of the present invention to provide a combined data receiver and latch capable of high-speed operation with minimal setup time.

It is a further object of the present invention to minimize the amount of circuitry required to implement a high-speed receiver/latch.

It is a further object of the present invention to minimize the effect of the receiver on system timing.

According to the invention, a high-speed receiver/latch is implemented by incorporating a differential amplifier/comparator directly into the feedback loop of a latch function. Both transparent and edge-triggered variants are possible. The resulting circuit is capable of extremely high-speed operation by virtue of very small setup time and small propagation delay.

In one embodiment of the invention, the receiver/latch includes a differential amplifier having two inputs and an output; an input switch having an input, an output and a control input; a feedback switch having an input, an output and a control input; at least one clock buffer having an input and at least one output; a data input; a reference input; a clock input; and a data output; the above-recited elements connected as follows: the data input is connected to the input of the input switch; the output of the input switch is connected to one input of the differential amplifier and to the output of the feedback switch; the reference input is connected to the other input of the differential amplifier; the output of the differential amplifier connects to the input of the feedback switch and to the data output; the clock input is connected to the input of the at least one clock buffer; and the at least one output of the at least one clock buffer is connected to the control input of the input switch and to the control input of the feedback switch such that when one of these two switches is open (not passing signal) the other is closed (passing signal) and vice versa.

Preferably, the receiver/latch includes a level translator having an input and an output, wherein: the output of the differential amplifier is connected to the input of the level translator, rather than to the data output and to the input of the feedback switch; and the output of the level translator is connected to the data output and to the input of the feedback switch, and a feedback inverter interposed in the path between the output of the level translator and the input of the feedback switch. These elements are arranged such that the logic sense of a feedback path formed by the differential amplifier, the level translator, the feedback inverter and the feedback switch is positive, when the feedback switch is closed.

Additionally, an edge-triggered high-speed receiver/latch may be constructed using the high-speed receiver/latch, as described above, and a transparent latch having a data input and an enable input, wherein: the logic sense of the enable input of the transparent latch is opposite to that of the high-speed receiver/latch and connected such that the data output of the high-speed receiver latch is connected to the data input of the transparent latch, the output of which is taken as the output of the edge-triggered high-speed receiver/latch and further connected such that the enable inputs of the high-speed receiver latch and the transparent latch are connected to the same clock input signal.

Other objects, features and advantages of the invention will become apparent in light of the following description thereof.

The following terms and abbreviations may be used herein: Emitter-Coupled Logic (ECL); Transistor-Transistor Logic (TTL); Field Effect Transistor (FET); Megahertz (MHz); Electronics Industry Association (EIA); Volts (V); and Complementary Metal Oxide Semiconductor (CMOS).

BRIEF DESCRIPTION OF THE DRAWINGS

FIG. 1b is an example of timing relationships between signals for the circuit of FIG. 1a.

DETAILED DESCRIPTION OF THE INVENTION

Figure 2:
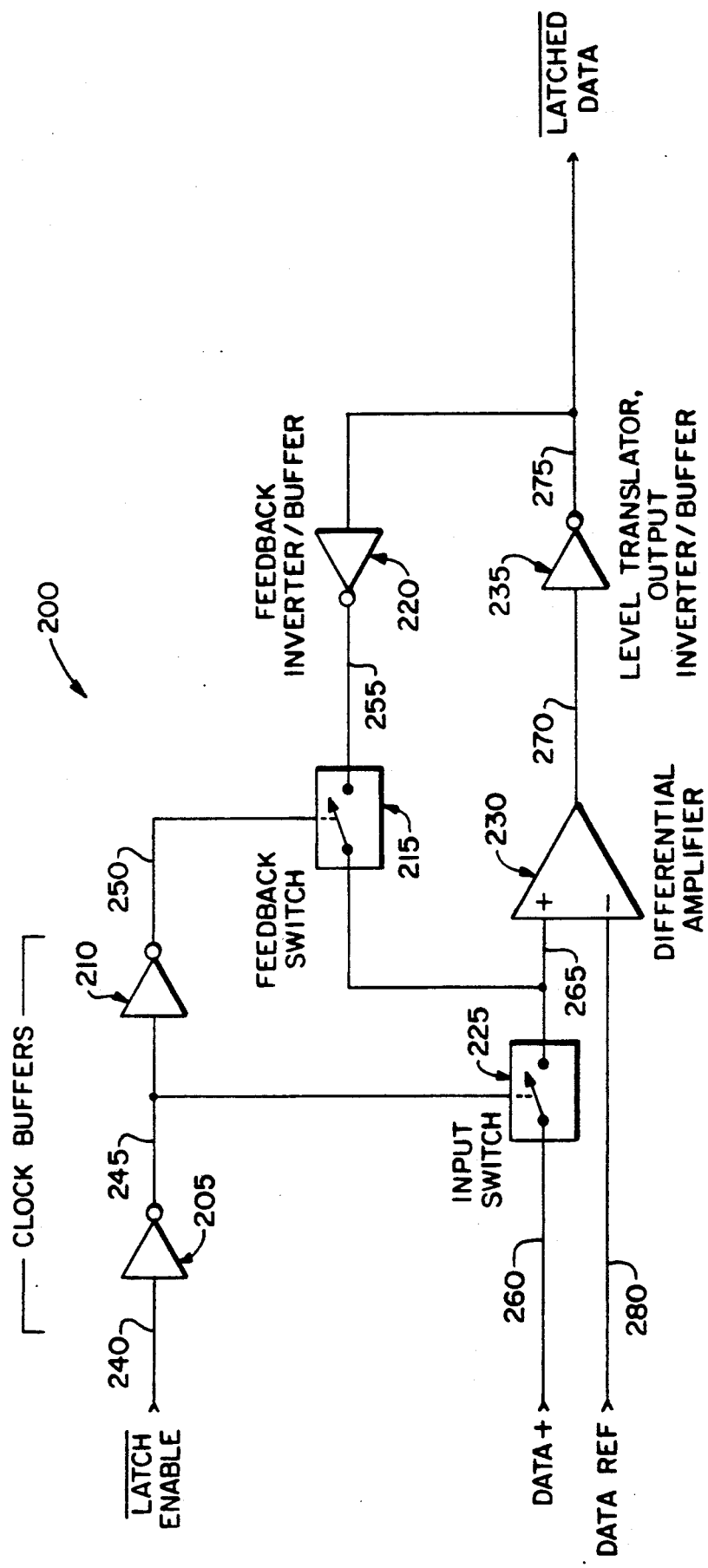
FIG. 2 is a schematic diagram of a preferred embodiment of the present invention.

According to the invention, and with respect to FIG. 2, there is a combined high-speed receiver/latch 200 comprising clock buffers (inverters) 205 and 210, a feedback switch 215, a feed back inverter/buffer 220, an input switch 225, a differential amplifier (comparator) 230, and a level translator/inverter/buffer 235. A clock input (LATCH ENABLE) 240, is applied to clock inverter/buffer 205 producing an output 245 which is further connected to the input of clock inverter/buffer 210, which produces another output 250, such that signals 245 and 250 are effectively the inverse of one another. Signal 250 is effectively a buffered version of the LATCH ENABLE signal 240. A "DATA +" input 260 is connected to input switch 225, which is in turn connected to the "+" input of differential amplifier 230 via a signal line 265. Signal 245 is connected to the control input of input switch 225 such that when LATCH ENABLE signal 240 is at a logic "0" level, input switch 225 is closed, effectively connecting "DATA +" 260 to the "+" input of differential amplifier 230, and effectively disconnecting "DATA +"

from the "+" input of differential amplifier 230 when signal 240 is at a logic "1" level. A reference voltage 280 (DATA REF) is connected to the "−" input of differential amplifier 230.

Also connected to the "+" input of differential amplifier 230 via line 265 is feedback switch 215. The control input of the feedback switch 215 is connected to signal 250 such that when input switch 225 is open, feedback switch 215 is closed, and vice versa. The output of differential amplifier 230 is applied via a signal line 270 to level translator/inverter/buffer 235 producing an output 275 which is taken as the overall data output signal of the receiver latch (LATCHED DATA), and which is further connected to feedback inverter/buffer 220. The output of feedback inverter/buffer 220 is connected via signal line 255 to feedback switch 215 such that when feedback switch 215 is closed, signal 255 is effectively connected to the "+" input of differential amplifier 230, and is effectively disconnected otherwise.

For purposes of this discussion, it is assumed that the logic levels of the "DATA +" signal 240 are approximately 0 volts for a logic "0" and approximately 2 volts for a logic "1". Accordingly, the voltage at DATA REF, signal 280, is set at 1 volt, to provide for maximum noise immunity. Internal logic levels will be assumed to be nominally zero volts for a logic "0" and five volts for a logic "1" (typical 5 V CMOS logic levels).

Figure 1B:
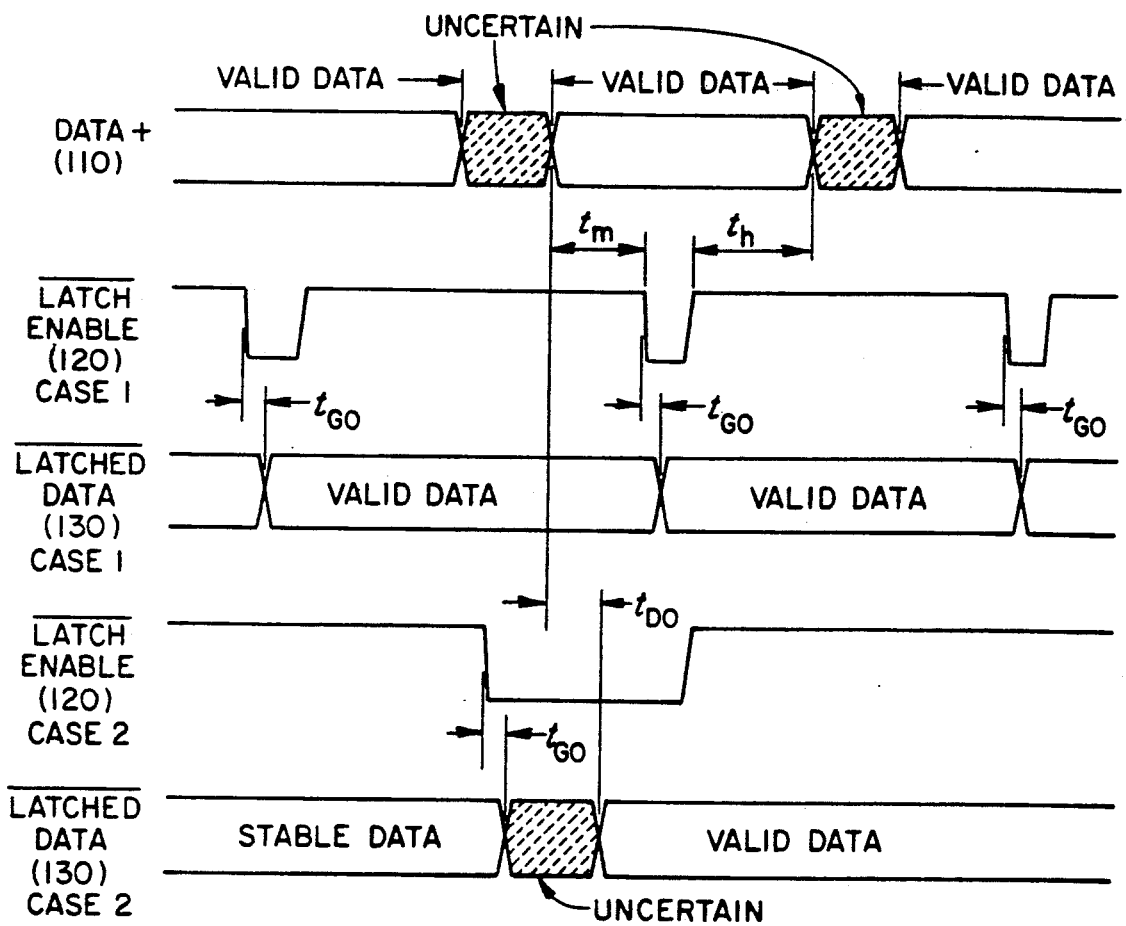
Figure 1A:
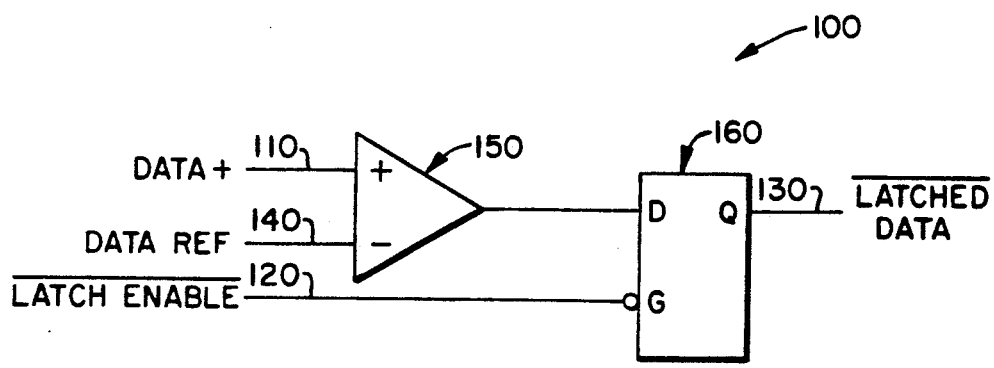
FIG. 1a is a schematic diagram of a prior art receiver and latch used to receive and latch a high-speed digital signal.

When LATCH ENABLE signal 240 is at a logic "0" level, then the "DATA +" signal 260 is applied to the "+" input of the differential amplifier 230, which amplifies the difference between the "DATA +" signal 260 and the DATA REF signal 280. This has the effect of converting "DATA +" from a low-level, floating reference logic signal into a higher level, fixed-reference logic signal 270 which may readily be processed. Level translator/buffer 235 converts the logic level of signal 270 into standard internal logic levels, and applies a logic inversion to produce output signal "LATCHED DATA" 275. As long as LATCH ENABLE remains at logic "0" level, LATCHED DATA, 275, will reflect the logical inverse of the state of "DATA +", delayed by a timed equal to the sum of the signal propagation delay through the differential amplifier 230 and one inverter delay. Compared to the delay through the discrete receiver latch combination of FIG. 1a, this is very fast.

Again with respect to FIG. 2, when the LATCH ENABLE signal 240 is at a logic "1" state, input switch 225 is opened and feedback switch 215 is closed. There is a short period while the switching is in process where both switches are open for a period approximately equal to one inverter delay. This is due to the delay between signals 245 and 250 caused by inverter 210. During this time, parasitic capacitances will keep the voltage on signal 265 at approximately the same level it had immediately before the switching. When the feedback switch 215 closes, a fully-buffered, positive-sense version the output of differential amplifier 230, i.e. the signal 255, is applied to the "+" input of the differential amplifier 230 via signal line 265 through the feedback switch 215. This positive feedback loop causes the amplifier to latch solidly, since the internal logic swings are even more extreme than the input signal swings.

The effective setup time required for this combined receiver/latch circuit is given approximately by the propagation delay through the differential amplifier 230 plus the inverter delay of level translator/inverter/buffer 235 plus the inverter delay of feedback inverter/buffer 220 minus the inverter delay of clock inverter/buffer 205 minus the inverter delay of clock inverter/buffer 210. This is effectively the propagation delay through the differential amplifier 230 alone and is a very small value compared to that required for the circuit of FIG. 1a.

The effective hold time required for the combined receiver latch is given approximately by the propagation delay through the clock inverter/buffer 205. Again, this is a very small value.

Figure 3:
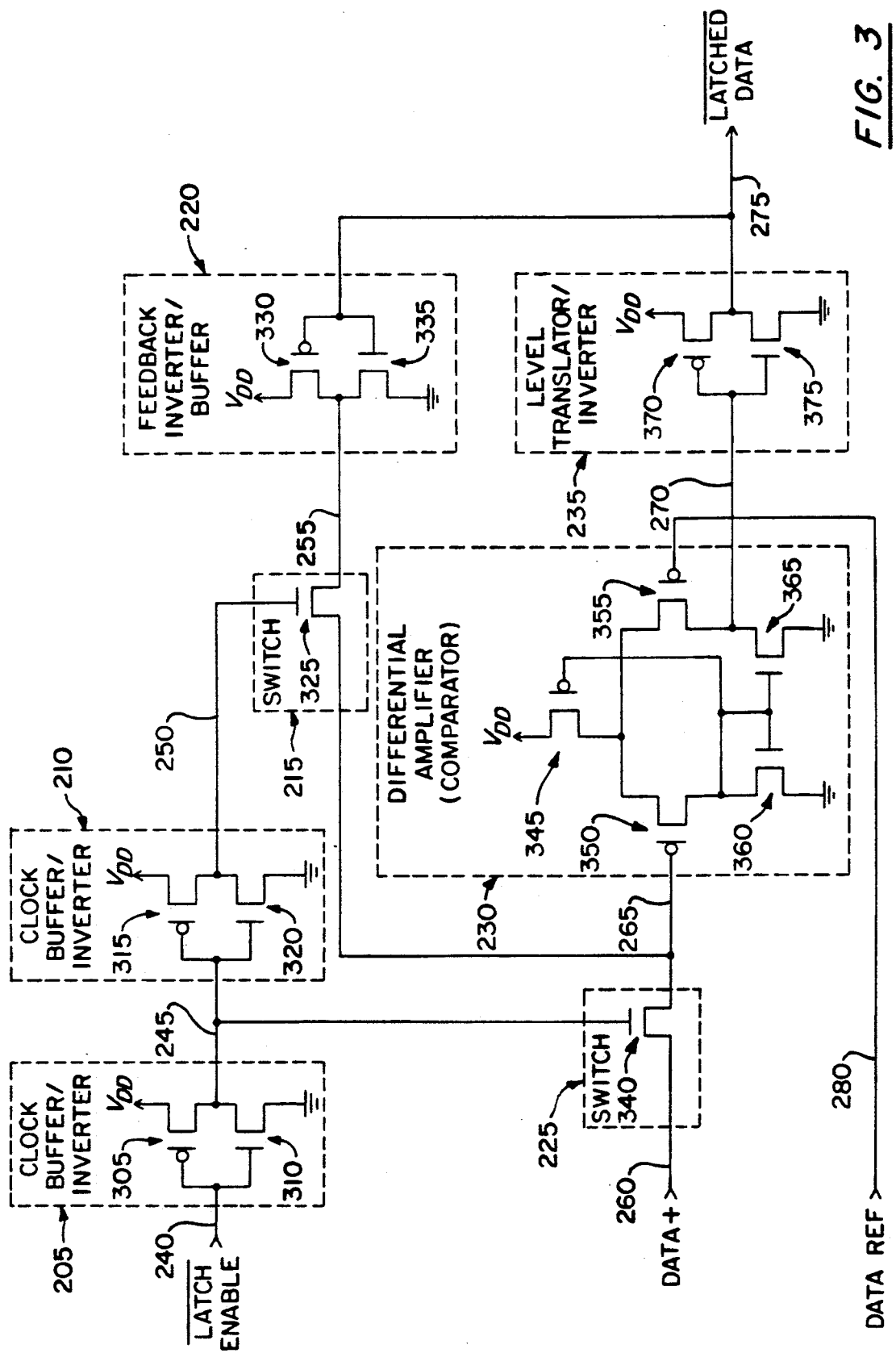
FIG. 3 is a transistor-level circuit diagram of the schematic diagram of FIG. 2 as it relates to the present invention.

FIG. 3 shows a complete transistor-level schematic of the circuit of FIG. 2. With respect to FIG. 3, clock inverter/buffer 205 comprises a p-channel transistor 305 and an n-channel transistor 310. Clock inverter/buffer 210 comprises a p-channel transistor 315 and an n-channel transistor 320. Feedback switch 215 comprises an n-channel transistor 325. Feedback inverter/buffer 220 comprises a p-channel 330 transistor and an n-channel transistor 335. Input switch 225 comprises an n-channel transistor 340. Differential amplifier/comparator 230 comprises p-channel transistors 345, 350 and 355, and n-channel transistors 360 and 365. Level translator/inverter 235 comprises a p-channel transistor 370 and an n-channel transistor 375. All other signal names, connections and references are identical to those of FIG. 2.

It should be noted that due to the exclusive use of p- and n-channel FETs, this circuit may be readily implemented in standard-cells or gate arrays.

Figure 4:
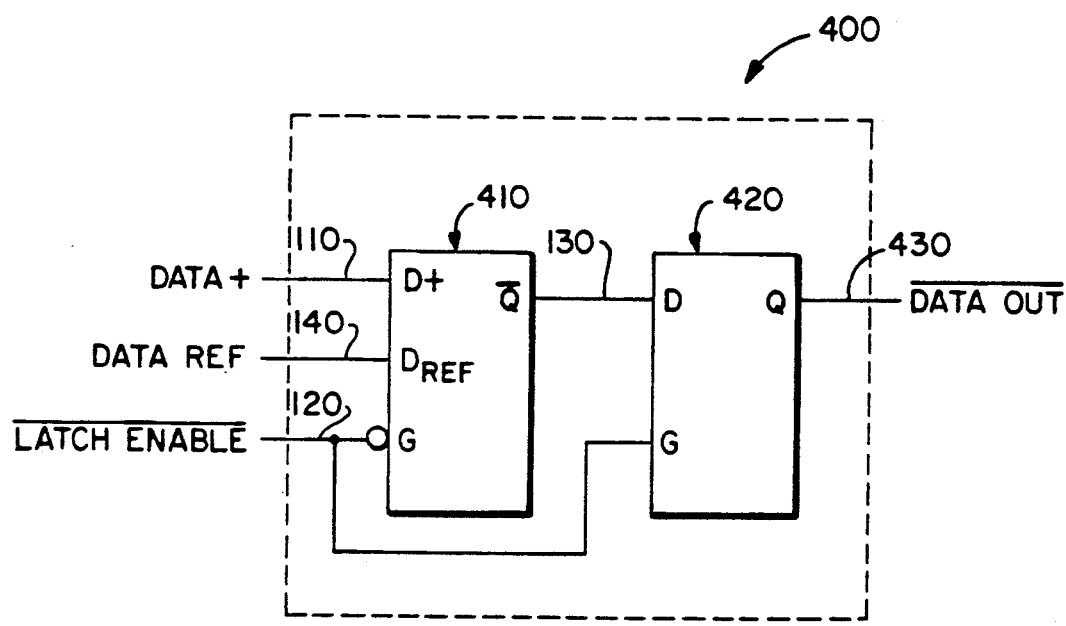
FIG. 4 is a block diagram of another embodiment of the present invention.

FIG. 4 shows another embodiment of the present invention. While the circuit of FIGS. 2, and 3 are based upon a transparent latch, the circuit of FIG. 4 incorporates the circuit of FIG. 2 and an additional transparent latch into a master/slave configuration, thus providing an edge-triggered flip/flop version of the receiver latch with identical setup and hold characteristics. With respect to FIG. 4, an edge/triggered receiver/latch 400 comprises receiver/latch 410 and transparent latch 420. Receiver latch 410 is a schematic symbol representing the circuit of FIG. 2, while latch 420 is an ordinary transparent latch. Note, however, that the sense of the ENABLE signals "G" for 410 and 420 is opposite. This is so that while one latch is transparent, the other is holding its data value, and vice versa. In this configuration, the operation is identical to that of the receiver/latch of FIG. 2, except that DATA OUT, signal 430, reflects the state of the "DATA +", signal 110, at the time of the last logic "0" to logic "1" transition of LATCH ENABLE.

The p-channel and n-channel transistors in the level translator are sized such that the effective input threshold voltage provides the proper level translation between the comparator's output levels and the 0 to 5 v CMOS levels.

What is claimed is:

1. A high speed receiver/latch comprising:
    a differential amplifier having two inputs and an output;
    an input switch having an input, an output and a control input;
    a feedback switch having an input, an output and a control input;
    at least one clock buffer having an input and at least one output;
    a data input;
    a reference input;
    a clock input; and a data output;

the above-recited elements connected as follows:

the data input is connected to the input of the input switch;

the output of the input switch is connected to one input of the differential amplifier and to the output of the feedback switch;

the reference input is connected to the other input of the differential amplifier;

the output of the differential amplifier connects to the input of the feedback switch and to the data output;

the clock input is connected to the input of the at least one clock buffer; and the at least one output of the at least one clock buffer is connected to the control input of the input switch and to the control input of the feedback switch such that when one of these two switches is open (not passing signal) the other is closed (passing signal) and vice versa; further comprising:

a level translator having an input and an output;

wherein:

the output of the differential amplifier is connected to the input of the level translator, rather than to the data output and to the input of the feedback switch; and the output of the level transistor is connected to the data output and to the input of the feedback switch.

2. A high speed receiver/latch, according to claim 1, further comprising:

a feedback inverter interposed in the path between the output of the level translator and the input of the feedback switch.

3. A high speed receiver/latch, according to claim 2, wherein:

the elements are arranged such that the logic sense of a feedback path formed by the differential amplifier, the level translator, the feedback inverter and the feedback switch is positive, when the feedback switch is closed.

4. A high speed receiver/latch, according to claim 1, wherein:

the elements are arranged such that the logic sense of a feedback path formed by the differential amplifier and the feedback switch is positive, when the feedback switch is closed.

5. A high speed receiver/latch, according to claim 1, wherein:

the at least one clock buffer comprises a first inverter and a second inverter, each of the first and second inverters having an input and an output;

the clock input is connected to the input of the first inverter;

the output of the first inverter is connected to the control input of the input switch and to the input of the second inverter; and the output of the second inverter is connected to the control input of the feedback switch.

6. An edge-triggered high-speed receiver/latch comprising:

a differential amplifier having two inputs and an output;

an input switch having an input, an output and a control input;

a feedback switch having an input, an output and a control input;

at least one clock buffer having an input and at least one output;

a data input;

a reference input;

a clock input; and a data output;

the above-recited elements connected as follows:

the data input is connected to the input of the input switch;

the output of the input switch is connected to one input of the differential amplifier and to the output of the feedback switch;

the reference input is connected to the other input of the differential amplifier;

the output of the differential amplifier connects to the input of the feedback switch and to the data output;

the clock input is connected to the input of the at least one clock buffer; and the at least one output of the at least one clock buffer is connected to the control input of the input switch and to the control input of the feedback switch such that when one of these two switches is open (not passing signal) the other is closed (passing signal) and vice versa;

further comprising:

a transparent latch having a data input and an enable input;

wherein:

the logic sense of the enable input of the transparent latch is opposite to that of the high-speed receiver/latch and connected such that the data output of the high-speed receiver latch is connected to the data input of the transparent latch, an output of the transparent latch is take as an output of the edge-triggered high-speed receiver/latch and further connected such that the enable inputs of the high-speed receiver latch and the transparent latch are connected to the same clock input signal.

7. A high speed receiver/latch, according to claim 1, wherein:

the at least one clock buffer comprises a first inverter and a second inverter, each of the first and second inverters having an input and an output;

the clock input is connected to the input of the first inverter;

the output of the first inverter is connected to the control input of the input switch and to the input of the second inverter; and the output of the second inverter is connected to the control input of the feedback switch.

8. A high speed receiver/latch, according to claim 1, wherein:

the elements are arranged such that the logic sense of a feedback path formed by the differential amplifier and the feedback switch is positive, when the feedback switch is closed.

* * * * *